United States Patent [19]

Leduc et al.

[11] Patent Number: 5,596,220
[45] Date of Patent: Jan. 21, 1997

[54] INTEGRATED LATERAL TRANSISTOR WITH IMPROVED CURRENT AMPLIFICATION

[75] Inventors: Pierre Leduc, Colleville-Montgomery; Bertrand Jacques, Thaon, both of France

[73] Assignee: U.S. Philips Corporation, New York, N.Y.

[21] Appl. No.: 334,611

[22] Filed: Jul. 20, 1989

Related U.S. Application Data

[63] Continuation of Ser. No. 172,997, Mar. 23, 1988, abandoned, which is a continuation of Ser. No. 940,477, Dec. 10, 1986, abandoned.

[30] Foreign Application Priority Data

Dec. 31, 1985 [FR] France .................... 85 19479

[51] Int. Cl.⁶ ............ H01L 27/082; H01L 27/102; H01L 29/70; H01L 31/11
[52] U.S. Cl. .......................... 257/587; 257/583; 257/584
[58] Field of Search .................. 357/35, 34, 65, 357/50; 257/578, 583, 584, 587

[56] References Cited

U.S. PATENT DOCUMENTS

| | | | |
|---|---|---|---|
| 4,205,333 | 5/1980 | Yamamoto | 357/35 |
| 4,510,676 | 4/1985 | Anantha et al. | 357/35 |
| 4,689,651 | 8/1987 | Hanna et al. | 357/35 |

FOREIGN PATENT DOCUMENTS

| | | | |
|---|---|---|---|
| 57-88769 | 6/1982 | Japan | 357/35 |

OTHER PUBLICATIONS

Last et al., "A Switching Lateral Transistor", IEEE Transactions on electron devices, vol. ED–18, No. 18, Aug. 1971, pp. 563 to 570.

*Primary Examiner*—Ngân V. Ngô
*Attorney, Agent, or Firm*—Steven R. Biren

[57] ABSTRACT

A method of manufacturing an integrated lateral transistor in which the depth and the doping level of the emitter region are such that the diffusion length of the minority carriers vertically injected into it is larger than or equal to the thickness of the emitter region. The distance between the peripheries of an electrical emitter connection zone and the emitter region is nominally larger than the alignment tolerance of an emitter contact window. This permits obtaining a transistor having an improved current amplification. An integrated circuit includes a lateral transistor, in which the ratio between the surface of the emitter region and that of the electrical emitter connection zone advantageous lies between 20 and 200.

5 Claims, 2 Drawing Sheets

INTEGRATED LATERAL TRANSISTOR WITH IMPROVED CURRENT AMPLIFICATION

This is a continuation of application Ser. No. 172,997, filed Mar. 23, 1988 now abandoned which is a continuation of Ser. No. 940,477, filed Dec. 10, 1986, now abandoned.

BACKGROUND OF THE INVENTION

The invention relates to a method of manufacturing an integrated lateral transistor, in which emitter and collector regions of a first conductivity type laterally spaced apart are obtained from the surface of a region of a second conductivity type opposite to the first conductivity type, the lateral space of said region of the second conductivity type between the emitter and collector regions forming a base region of the transistor, in which method there are then formed through windows of an insulating layer deposited at least on said emitter and collector regions electrical emitter and collector connections, each of which has a zone in electrical contact with said emitter region and with said collector region, respectively.

Such a method is generally known from French Utility Model FR 2254106 (National Semiconductor) in FIG. 1 thereof.

It is known to a person skilled in the art that the current amplification of lateral transistors is limited because of the phenomenon of vertical injection. The solutions proposed hitherto consist of reducing the surface of the emitter in order to reduce the vertical injection and hence to increase the current amplification. In order to obtain a lateral transistor, a person skilled in the art generally chooses an emitter contact surface as small as permitted by the manufacturing technology and consequently realizes an emitter also as small as possible while taking into account positioning tolerances corresponding to the method chosen in order to avoid the emitter contact causing an emitterbase shortcircuit.

A certain number of solutions have been proposed to reduce the phenomenon of vertical injection by limiting the effective surface of the emitter. These solutions have the consequence that they necessitate either a modification of the method or the addition thereto of a supplementary step.

French Patent 2 028 146 (N.V. Philips) envisages for limiting the vertical injection to form the emitter zone as a very small superficial zone. Since such a small zone cannot possibly be realized, this Patent proposes as a solution to form an emitter zone thicker than the collector zone in order that only the emitter zone attains a buried layer.

This known method requires a supplementary diffusion and has the disadvantage that the emitter-base capacitance is increased.

French Patent 2365213 (Thomson-C.S.F.) proposes to diffuse into the emitter a very highly doped zone of a type opposite to that of the emitter, an electrical contact covering at least in part the surface of the junction between this very highly doped zone and the emitter. It is clear that this solution also implies a supplementary processing step.

SUMMARY OF THE INVENTION

Applicants have noticed that surprisingly the global minimization of the vertical injection surface did not necessarily lead to the optimum amplification for a lateral transistor having a small emitter thickness, such as those manufactured in a thin epitaxial layer according to the oxide insulation technology.

The present invention has for its object to provide a method which permits increasing the amplification of lateral transistors by optimizing the geometry of the emitter of the transistor in a manner corresponding to the phenomenon of vertical injection, which, in contrast with the information according to the prior art, leads to the enlargement of the dimensions of the emitter.

The method according to the invention is thus characterized in that the depth and the doping level of the said emitter region are such that the diffusion length of the minority carriers injected vertically into it is larger than or equal to the thickness of said region, and in that the distance between the peripheries of said electrical emitter connection zone and the emitter region is at least over a part of said oppositely arranged peripheries nominally larger than the alignment tolerance between a said window and a said emitter region and is chosen so that the amplification of the transistor is larger than that of a transistor which has the same surface of the electrical emitter connection and of which said distance between the peripheries of the said electrical emitter zone and said emitter region is nominally equal to said alignment tolerance.

The electrical emitter zone may advantageously have the minimum surface permitted by the method.

The electrical emitter connection zone may be a first square having sides $L_1$ being inscribed in a second square having sides $L_2$ constituting the emitter region, $L_2-L_1$ being larger than twice the alignment tolerance.

The ratio between the surface of said emitter region and that of said electrical emitter connection zone may lie between 20 and 200. According to a preferred embodiment, said ratio is substantially equal to r, r designating the ratio between the injection density under said electrical emitter connection zone and the injection density under said insulating layer.

The invention further relates to an integrated circuit comprising a lateral transistor having emitter and collector regions of a first conductivity type laterally spaced apart and extending from the surface of a region of a second conductivity type opposite to the first conductivity type, the lateral part of said region of the second type between the emitter and collector regions forming the base of the transistor and comprising electrical emitter and collector connections, each of which has a zone in electrical contact through windows of an insulating layer with said emitter region and with said collector region, respectively.

Such a transistor is also known from French Utility Model FR 2254106 (National Semiconductor) in its FIG. 1. According to the invention, the geometry of the transistor is optimized so that the phenomenon of vertical injection is taken into account, this in contrast with the aforementioned article, which leads to the minimization of the emitter surface.

The transistor according to the invention is thus characterized in that the emitter region has a depth and a doping level such that the diffusion length of the minority carriers injected vertically into it is larger than or equal to the thickness of said region and in that the ratio between the surface of said emitter region and that of said electrical emitter connection zone lies between 20 and 200.

According to a preferred embodiment, this ratio is substantially equal to r, r designating the ratio between the injection density under said electrical emitter connection zone and the injection density under said insulating layer.

BRIEF DESCRIPTION OF THE DRAWING

In order that the invention may be readily carried out, it will now be described more fully, by way of example, with reference to the accompanying drawings, in which.

DESCRIPTION OF THE PREFERRED EMBODIMENTS

Figure 1:
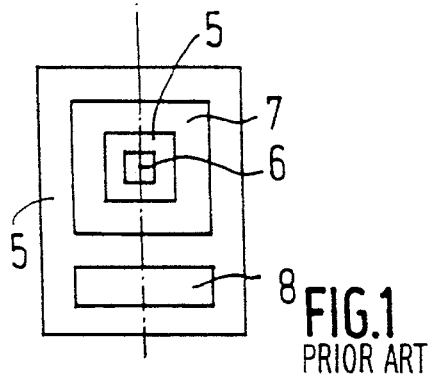
FIGS. 1 and 2 show a lateral transistor according to the prior art.
Figure 2:
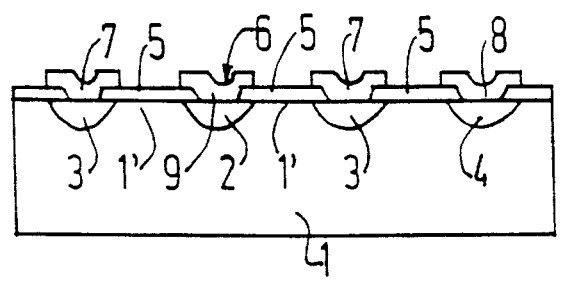

According to FIGS. 1 and 2, a lateral transistor as described in French Utility Model FR 2254106 (National Semiconductor) comprises an emitter region 2 of square form and a collector region 3 having external and internal contours of square form of a first conductivity type diffused into a semiconductor body 1 of the second conductivity type. The base of the transistor is constituted by the part 1' of the body 1 situated between the emitter and collector regions. A highly doped region 4 of the second conductivity type is also diffused into the body 1 outside the collector region and serves to facilitate the formation of the base contact. The emitter contact 6, the base contact 8 and the collector contact 7 are formed through openings of a layer 5 of $SiO_2$ aligned with respect to the subjacent emitter-base and collector regions. Reference numeral 9 denotes the zone in which the emitter contact 6 is effectively in electrical connection with the emitter.

According to the prior art, such an emitter contact 6 is formed in such a manner that the zone 9 occupies the largest possible part of the emitter surface, which moreover reduces to a minimum the emitter resistance, a low emitter resistance being a priori favorable for a high current amplification. In order to obtain an optimum current amplication, it is otherwise desirable that the emitter is as small as possible. Therefore, it is usual to give the zone 9 the smallest possible surface compatible with the method and to form an emitter 2 having the smallest possible surface compatible with the alignment tolerance of the opening corresponding to the contact 6. In fact, it should be avoided that the zone 9 shortcircuits the emitter-base junction. This alignment tolerance is equal to the nominal positioning tolerance of the masks, for example of the order of 2 µm increased by a safety value (in general smaller than 1 µm).

The general evolution of the integrated circuit technique has led to the use of oxide insulation methods such as described, for example, in French Patent No. 1 549 386 (N.V. Philips) and in its addition 2 081 017.

In such methods, the components are formed in a thin epitaxial layer (having a thickness of the order of 1.5 µm) and are insulated from each other by layers of $SiO_2$ which reach the substrate on which the epitaxial layer is formed. The islands surrounded by the layers of $SiO_2$ can be closed on the lower side by a buried layer of a conductivity type opposite to that of the substrate. The formation of lateral transistors according to such a technology leads for the emitters to thicknesses and to doping levels such that the diffusion length of the minority carriers vertically injected is larger than or equal to the thickness of the emitters, in other words that the carriers vertically injected into an emitter traverse this emitter.

Applicant has shown that for a lateral transistor having such an emitter the length of the diffusion of the minority carriers vertically injected into it is larger than or equal to the thickness of the emitters, the criteria used before (maximum contact surface on a minimum emitter surface) no longer being optimum. Moreover, it has been possible to take into account the phenomenon of vertical injection associated with such a configuration on the basis of certain theoretical hypotheses with respect to the properties of such an injection which are verified by experiments. They have permitted obtaining a simplified injection model giving accurately verified numerical values to the first order by experiments and will be explained hereinafter with reference to FIGS. 3a and 3b.

Figure 3A:
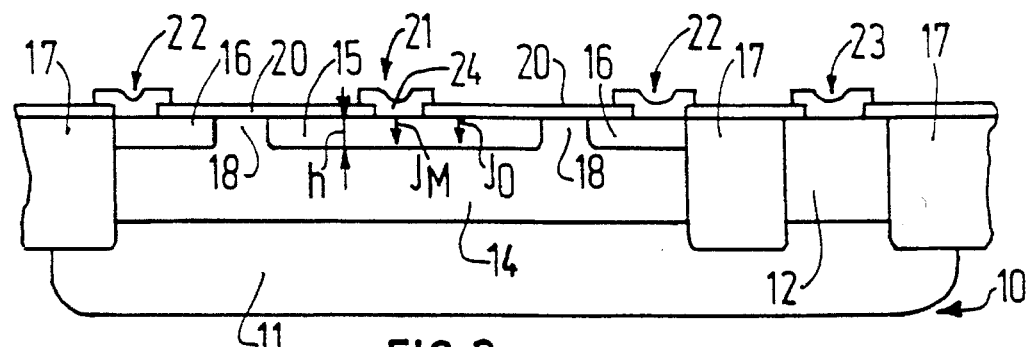
FIGS. 3a and 3b show a lateral transistor according to an embodiment of the invention.
Figure 3B:
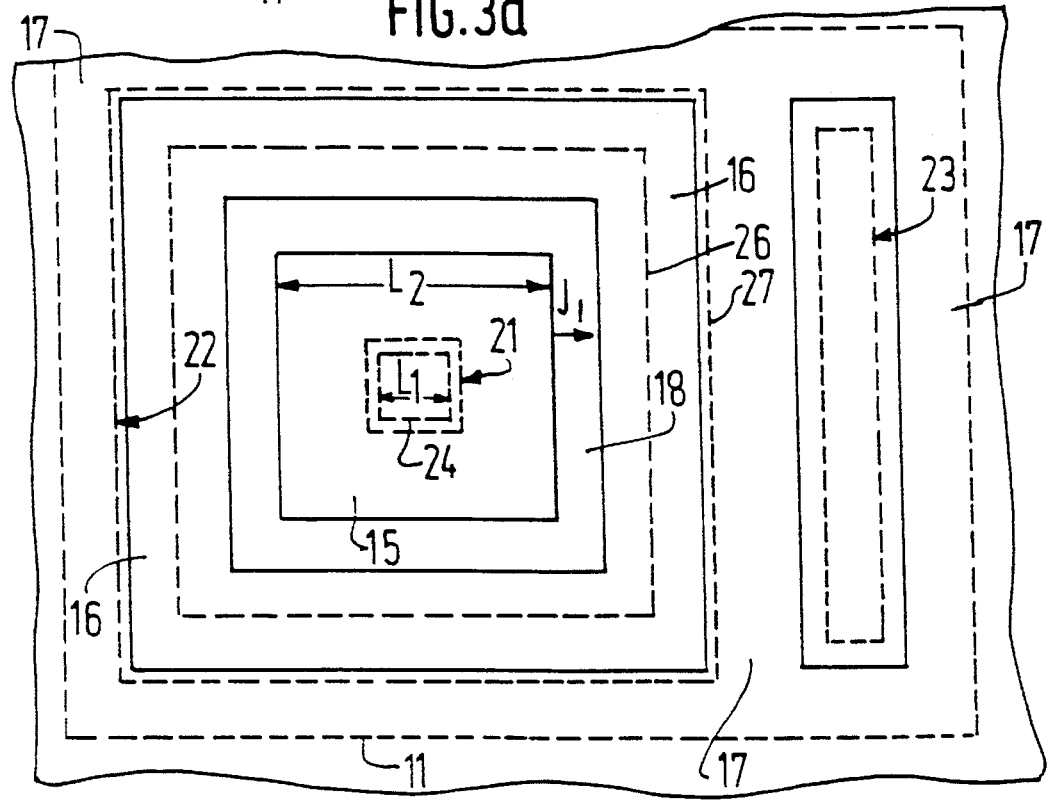

The lateral transistor shown in FIGS. 3a and 3b is formed according to the oxide insulation technology in which a substrate 10, for example of the p-type, is locally provided with a highly doped buried layer of the opposite (i.e. n+) type. The substrate 10 is covered by an epitaxial layer of the opposite (i.e. n) type comprising in this case localized islands 14 and 12 constituting an island for the lateral transistor and a base contact island 12, respectively, electrically connected to each other by means of the highly doped buried layer 11. The island 14 has a square form and the island 12 has a rectangular form. These two islands are limited along their peripheries by a thick oxide ($SiO_2$) (having a thickness of about 1 to 1.5 µm), which extends from the surface of the epitaxial layer to the substrate while intercepting the contour of the buried layer 11.

The island 14 comprises diffused zones 15 and 16 of the same type as the substrate 10, i.e. of the p-type. The region 15 is disposed at the center of the island 14 and is shown in plan view in the form of a square having sides $L_2$. Its depth is h. It constitutes the emitter of the lateral transistor. The region 16 is limited internally by a square spaced apart from the emitter region 15 and externally by the thick oxide 17. The region 18 of the island 14 disposed between the emitter 15 and the collector 16 constitutes the base of the lateral transistor.

A thin insulating layer, for example of oxide and of nitride, having a thickness of a few tenths of a micron is deposited on the surface of the epitaxial layer and of the thick oxide 17 and has openings intended to receive the electrical connections of the transistor. The electrical emitter connection is constituted by a metallic layer 21 of square form and has a zone 24 constituted by a square having sides $L_1$ in effective contact with the emitter region 15. The electrical base connection is constituted by a metallic layer 23 of rectangular form in electrical contact with the base 18 successively through the island 12, the buried layer 11 and the island 14. The electrical collector connection is constituted by a metallic layer 22, whose internal and external contours 26 and 27, respectively, are limited by squares; the external contour 27 can be situated, as shown, above the thick oxide 17.

$J_m$ designates the vertical injection current density of the minority carriers under the zone 24 of the emitter metallization 21 and J designates the vertical injection current density of the minority carriers under the oxide 20 of the emitter 15. $J_1$ designates the lateral injection current density of the minority carriers in the base 18 of the lateral transistor. Finally, $I_m$, $I_o$ and $I_1$ designate the vertical injection currents under the zone 24 and under the oxide 20 of the emitter 15 and the lateral injection current in the base 18, respectively, corresponding to the current densities defined above. It should be noted that the recombinations in the base will be neglected.

The current amplification β of the transistor is then expressed as follows:

$$\beta = \frac{I_l}{I_m + I_o} = \frac{4khL_2J_1}{J_o(L_2^2 - L_1^2) + J_mL_1^2} \quad (1)$$

k being a factor having a form approximately equal to 1 and depending upon the form of the profile of the emitter junction.

If a priori the value of $L_1$ is fixed at the minimum value permitted by the manufacturing method, for example 3 μm, it follows that $$\beta = \frac{AL_2}{L_2^2 + B} \quad (2)$$

with $$A = \frac{4J_1kh}{J_o}$$

$$B = L_1^2 \left( \frac{J_m}{J_o} - 1 \right) = L_1^2 C$$

A, B and C are constants. In fact, Applicant have shown that the ratio $J_m/J_o$ is constant and is determined solely by the manufacturing method. Its value depends upon the quality of the insulating layer 20, especially upon the charges trapped therein. With modern manufacturing methods, it is estimated that its value is of the order of 50.

It is also considered on first approximation that the ratio $J_1/J_o$ is constant and independent of the geometry used.

These hypotheses now permit determining the optimum value of $L_2$. When differentiating the formula (2) with respect to $L_2$ it follows that:

$$\beta'(L_2) = \frac{A(B - L_2^2)}{(L_2^2 + B)^2} \quad (3)$$

The curve of amplification as a function of $L_2$ then has a maximum value for $L_2^2=B$, i.e.:

$$\frac{L_2^2}{L_1^2} = \frac{J_m}{J_o} - 1 = C \simeq r$$

That is to say that the ratio between the surface of the zone 24 and that of the emitter 15 is equal to C and depends only upon the ratio between the injection densities under the metallization and under the oxide. The optimum amplification $\beta_{opt}$ then has the value:

$$\beta_{opt} = \frac{A}{2\sqrt{B}} \quad (4)$$

Figure 4:
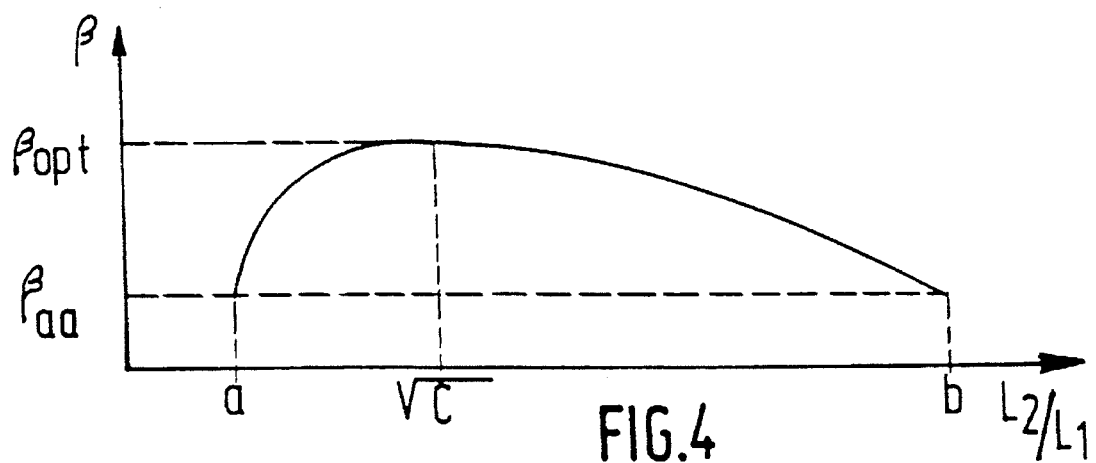
FIG. 4 shows a curve of said transistor representing presenting β as a function of the ratio $L_2/L_1$.

The curve of amplification as a function of the ratio $L_2/L_1$, where $L_1$ is given, is shown in FIG. 4. The ascending part of this curve is relatively steep: its top is fairly flat and for ratios exceeding the maximum value its fall is slow.

According to the prior art, the ratio $L_2/L_1 = a$ generally lies between 2 and 3. By way of example corresponding to a=3, $L_1$=3 μm and $L_2$=9 μm, which leaves a margin of 3 μm for the positioning tolerance of the mask used to open the metallization emitter windows increased by a safety distance so that the emitter-base shortcircuits by the said metallization are avoided.

The amplification $\beta_{aa}$ of such a device according to the prior art then has the value:

$$\beta_{aa} = \frac{aAL_1}{a^2L_1^2 + B} \quad (5)$$

From the formulae (4) and (5) there is obtained:

$$\frac{\beta_{opt}}{\beta_{aa}} = \frac{a^2 + C}{2a\sqrt{C}} \quad (6)$$

This ratio also depends only upon the ratio between the injection densities under the metallization and under the oxide. For r=50 and a=3, this ratio is then equal to 1.38. Consequently, all conditions being the same, an improvement of about 40% with respect to a lateral transistor according to the prior art having a ratio a=3 is otherwise obtained.

For values of $L_2/L_1$ exceeding the optimum value, the fall of the curve is slow. For $$\frac{L_2}{L_1} = b$$

the same value for the amplification $\beta_{aa}$ is found. From the formulae (2) and (5), there is obtained:

$$b = \frac{C}{a},$$

i.e. about 17 in the preceding example, which corresponds to a ratio between the emitter surface and the emitter contact zone of the order of 270.

It should be noted that the calculations effected above, by which only surface ratios are obtained, remain valid for other geometries of emitters having a convex contour, for which there is an optimum value corresponding to a ratio between the emitter surface and the emitter contact zone equal to C, i.e. about 50 in the example chosen, while according to the prior art this ratio generally does not exceed 9. This surface ratio may advantageously lie between 20 and 200. The lower limit corresponds approximately to a doubling of the ratio with respect to the prior art, which provides for a substantial improvement of the amplification, and the upper limit corresponds to the maximum volume that is generally acceptable in practice for an emitter of a lateral transistor.

What is claimed is:

1. A semiconductor device comprising a lateral transistor having a surface-adjoining region of a second conductivity type, emitter and collector regions of a first conductivity type opposite to that of the second and at least partly covered by an insulating layer, said emitter and collector regions being laterally spaced apart and extending from the surface of said region of the second type between the emitter and collector regions forming the base of the transistor, said device comprising electrical emitter and collector connections, each of said emitter and collector connections having a zone in electrical contact, through windows in said insulating layer, with said emitter region and with said collector region, respectively, characterized in that the emitter region has a thickness and a doping level such that a diffusion length of minority carriers vertically injected into the emitter region is larger than or equal to the thickness of said emitter region and in that the ratio between the surface area of said emitter region and the surface area of said electrical emitter connection zone lies between 20 and 200.

2. A semiconductor device as claimed in claim 1, characterized in that said ratio is further limited to be substantially equal to the ratio between an injection density under said electrical emitter connection zone and an injection density under said insulating layer.

3. A semiconductor device as claimed in claim 1 or 2, characterized in that said ratio is substantially equal to 50.

4. A semiconductor device as claimed in claim 1 or 2, characterized in that said electrical emitter connection zone is a first square having sides $L_1$ being inscribed in a second square having sides $L_2$ and constituting the said emitter region, the ratio $(L_2)^2/(L_1)^2$ lying between 20 and 200, the collector region having a square internal contour surrounding the emitter region.

5. A semiconductor device as claimed in claim 1 or 2, characterized in that said device is an integrated circuit comprising said lateral transistor.

* * * * *